(12) United States Patent
Schmidt

(10) Patent No.: US 6,624,495 B2
(45) Date of Patent: *Sep. 23, 2003

(54) ADJUSTABLE THRESHOLD ISOLATION TRANSISTOR

(75) Inventor: Dominik J. Schmidt, San Jose, CA (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/016,157

(22) Filed: Jan. 30, 1998

(65) Prior Publication Data

US 2001/0050415 A1 Dec. 13, 2001

Related U.S. Application Data

(60) Provisional application No. 60/044,243, filed on Apr. 23, 1997.

(51) Int. Cl.[7] ............................................. H01L 29/00
(52) U.S. Cl. .................. 257/509; 257/356; 257/368; 257/394; 257/395
(58) Field of Search ................................ 257/355, 356, 257/360, 394, 395, 396, 397, 398, 399, 400

(56) References Cited

U.S. PATENT DOCUMENTS

| | | | | |
|---|---|---|---|---|
| 4,990,983 A | * | 2/1991 | Custode et al. ............. | 257/398 |
| 5,929,491 A | * | 7/1999 | Hebbeker et al. ........... | 257/355 |
| 6,100,561 A | * | 8/2000 | Wang .......................... | 257/344 |
| 6,259,140 B1 | * | 7/2001 | Liu .............................. | 257/360 |

FOREIGN PATENT DOCUMENTS

| | | | | |
|---|---|---|---|---|
| JP | 3-16154 | * | 1/1991 | ................. 257/398 |
| JP | 3-147359 | * | 6/1991 | ................. 257/394 |

OTHER PUBLICATIONS

Principles of CMOS VLSI Design, A Systems Perspective, Neil Weste and Kamran Eshraghian. 1985, Chapter 3, CMOS Processing Technology, pp. 64–98.

* cited by examiner

*Primary Examiner*—Wael Fahmy
*Assistant Examiner*—Nathan W. Ha
(74) *Attorney, Agent, or Firm*—Townsend and Townsend and Crew LLP

(57) ABSTRACT

An method and apparatus for high voltage control of isolation region transistors (320) in an integrated circuit. Isolation region transistors (320) are formed between active devices by selective implantation of channel stop implants (140). Isolation region transistors (320) are those areas with a conductor (130) over an isolation region (120) with no channel stop implant (140). This provides an isolation region transistor (320) with a lower threshold voltage than the areas with channel stop implant (140). The voltage threshold of the isolation region transistors 320 are adjustable to a range of voltages by varying the length of channel stop implant (140). The apparatus may be fabricated using conventional fabrication processes.

28 Claims, 9 Drawing Sheets

ADJUSTABLE THRESHOLD ISOLATION TRANSISTOR

This application claims the benefit of Provisional Application Ser. No. 60/044,243, filed Apr. 23, 1997, incorporated herein by reference for all purposes.

BACKGROUND OF THE INVENTION

This invention relates, in general, to integrated circuit technology, and more particularly to isolation region transistors with variable threshold voltages.

Integrated circuits in general are plagued with certain parasitic characteristics. These characteristics often cause unintended results in the integrated circuit. In particular, parasitic transistors may occur on an integrated circuit where a conductive region carries a voltage over an isolation region that lies between two diffusion regions. As will be recognized, this structure forms a transistor. If the voltage on the conductive region is high enough, the transistor turns on and electricity conducts through a channel under the isolation region between the two diffusion regions.

In the past, such parasitic transistors were undesirable. To remove them, semiconductor designers implanted the areas under the isolation region with channel stop implants. The channel stop implants raised the threshold voltage above the voltage level on the conductive regions. However, it is desirable to find a beneficial use from such parasitic transistors.

FIG. 1 shows a cross-section of an integrated circuit 100 with a parasitic transistor. Two transistor devices 110 are separated by a field oxide 120. Field oxide 120 electrically isolates devices 110 from each other. Devices 110 are shown as transistors with source and drain regions and a polysilicon gate. However, these devices may be any active device, such as diodes, transistors, and the like. Devices 110 may reside in a doped well 125 used to electrically bias the environment of devices 110, or may be formed in an undoped substrate. FIG. 1 shows n-type devices residing in a p-type well, however the opposite configuration is also used to form p-type devices.

Conductive region 130 lies on top of field oxide 120. Conductive region 130 may be polysilicon, metal, or other conductive material. For example, conductive region 130 may be a polysilicon trace for carrying interconnection signals between various devices on integrated circuit 100. Consequently, at times, conductive region 130 may carry a voltage bias.

It will be recognized by one of skill in the art, that this structure forms a parasitic transistor. Conductive region 130 acts as a gate, the two diffusion regions of devices 110 as the source and drain, and field oxide 120 as an insulating layer under the gate. When a voltage of sufficient magnitude, to overcome a threshold voltage is applied to conductive region 130, conduction may occur in a channel region between the two diffusion regions.

To compensate for this effect, it has been known to add a channel stop implant 140 beneath field oxide 120. Channel stop implant 140 is typically a doped material which raises the voltage threshold $V_t$ of the parasitic transistor. Channel stop implant 140 is typically sufficient to raise $V_t$ higher than any of the voltages used on the integrated circuit. Channel stop implant 140 is also known as a "field implant." Typically, with no channel stop implant 140, $V_t$ of the parasitic transistor is approximately 8 volts to 10 volts. With channel stop implant 140, $V_t$ is approximately 18 volts to 20 volts. In some embodiments, with no well 125 and no channel stop implant, $V_t$ may be even lower, perhaps 2–3 volts.

One area in which presently available integrated circuits are limited is in their ability to handle voltages higher than the supply voltage (i.e., VDD.) Some integrated circuits, including programmable logic devices, EPROM memories, EEPROM memories, voltage pumps, etc. use higher voltages. For example, programmable logic device use $V_{pp}$, in a range from 6 volts to 16 volts, for programming logic functions. Currently available integrated circuits are limited in their ability to control devices using these higher voltages. Other high voltage problems, such as electrostatic discharge circuitry is also limited by currently available technology.

Consequently, new integrated circuit technology and methods for fabricating the integrated circuits are needed. In particular, a beneficial use for parasitic transistors is desirable.

SUMMARY OF THE INVENTION

The present invention provides an integrated circuit device that uses parasitic transistors beneficially as isolation region transistors. The isolation region transistors can withstand high voltages without breaking down. The present invention also provides a method for fabricating integrated circuits with isolation region transistors using existing integrated circuit fabrication processes.

The isolation region transistors are formed between the diffusion regions active devices. That is, the diffusion regions are the source and drain of the isolation region transistor, and a conductive region above an isolation region separating the diffusion regions is the gate. A channel stop implant is selectively implanted beneath the isolation region. This effectively provides a lower threshold voltage for the regions with no channel stop implant, compared with the threshold voltage for the regions with a channel stop implant. Thus, when the conductor carries sufficient voltage to exceed the threshold voltage in the regions with no channel stop implant, the isolation region transistor conducts, while the regions with the channel stop implant do not.

In a further embodiment of the present invention, a variable threshold isolation region transistor is provided. That is, the threshold voltage of an isolation region transistor may be varied using conventional integrated circuit fabrication methods. Briefly, the channel stop implant is formed in selected regions, but its length is varied, depending on the desired threshold voltage. Within a range, varying the length of the channel stop implant predictably varies the voltage threshold. The threshold voltage can be further varied by selectively placing the isolation region transistor in a doped well region.

The isolation region transistors provide, for example, a transistor device that can withstand higher voltages, such as the programming voltage $V_{pp}$, of an programmable integrated circuit. Especially advantageous is that the isolation region transistors can be fabricated with currently available and widely used fabrication processes. Further, many differing requirements may be addressed by the present invention, since the threshold voltage of the isolation region transistors may be varied from 2 volts to greater than 20 volts, again with no change to the fabrication process. This gives designers great flexibility, especially in high voltage designs.

A further understanding of the nature and advantages of the inventions herein may be realized by reference to the remaining portions of the specification and the attached drawings.

DETAILED DESCRIPTION OF THE SPECIFIC EMBODIMENTS

Figure 2:
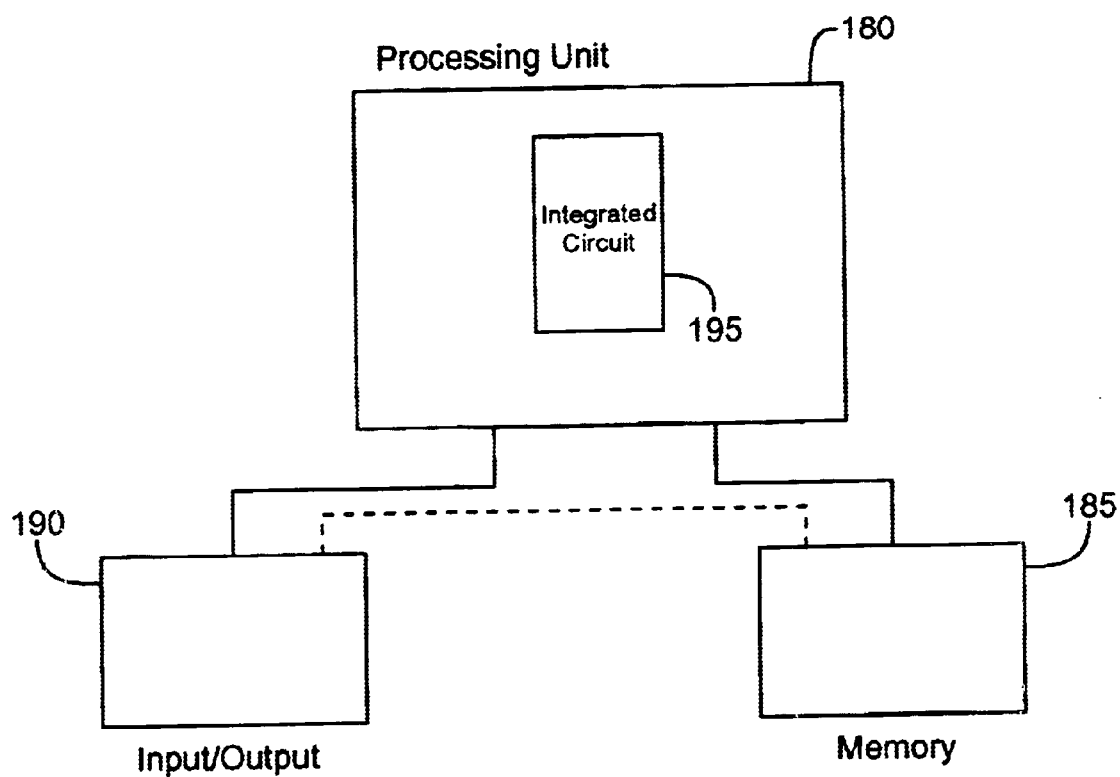
FIG. 2 shows a digital system using the integrated circuit of the present invention.

FIG. 2 illustrates a typical environment in which an integrated circuit having been designed according to the principles of the present invention may be embodied. A digital system has a processing unit 180 that is coupled with a memory 185 and an input/output device 190. A personal computer is an example of such a digital system. However, a wide variety of electronic and consumer products will find beneficial use from the present invention. The present invention will find application in telecommunications, switches, networks, and many other areas of technology.

The digital system of FIG. 2 contains one or more integrated circuits 195 as described in the present invention. Integrated circuit 195 may be a programmable logic device, EPROM memory, EEPROM memory, Flash memory, microprocessor, controller, or a myriad of other integrated circuits. In FIG. 2, integrated circuit 195 is shown as a part of processing unit 180. However, memory 185 or input/output device 190 may also contain integrated circuit 195.

The digital system shown may be embodied on a single board, on multiple boards, or even within multiple enclosures. Furthermore, the digital system may comprise any multiple or combination of the devices shown. For example, the digital system may have multiple processing units 180, or have no processing unit 180 at all. One of the advantages of an integrated circuit is its logical flexibility. Consequently, one with skill in the art can readily envision many applications for utilizing such a device within a variety of digital systems.

Figure 3A:
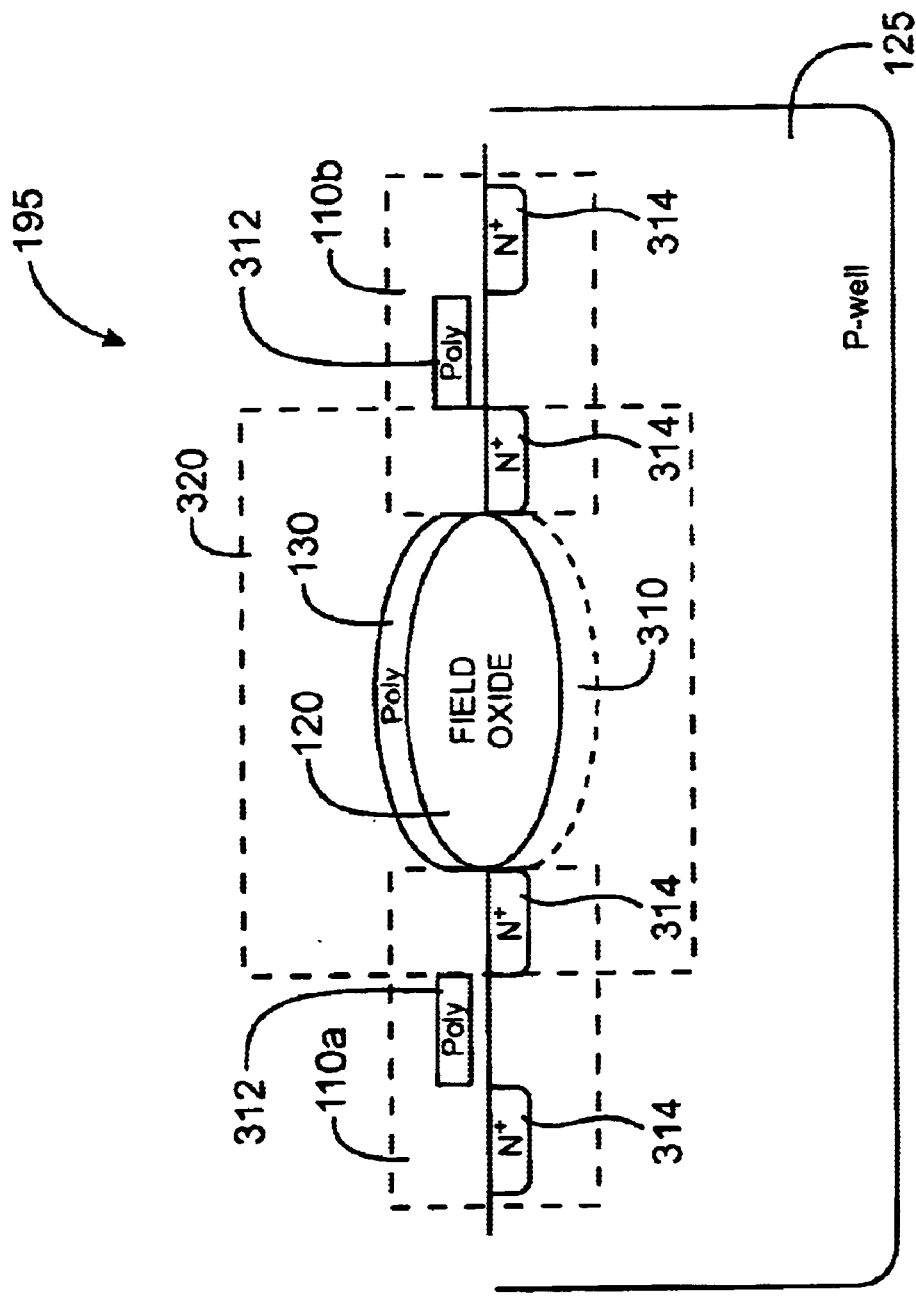
FIG. 3A shows a cross-section of an isolation region transistor of the present invention with the channel stop implant removed.

FIG. 3A shows a cross-section of a portion of integrated circuit 195. Integrated circuit 195 has two devices 110a and 110b (referred to collectively as devices 110) separated by field oxide 120. In FIG. 3A, devices 110 are transistor devices, but in other embodiments could be diodes, memory transistors, EPROM, EEPROM, or Flash memory cells, etc. Devices 110a and 110b may or may not be similar types of devices. Devices 110 are characterized by the existence of a diffusion region.

Figure 3B:
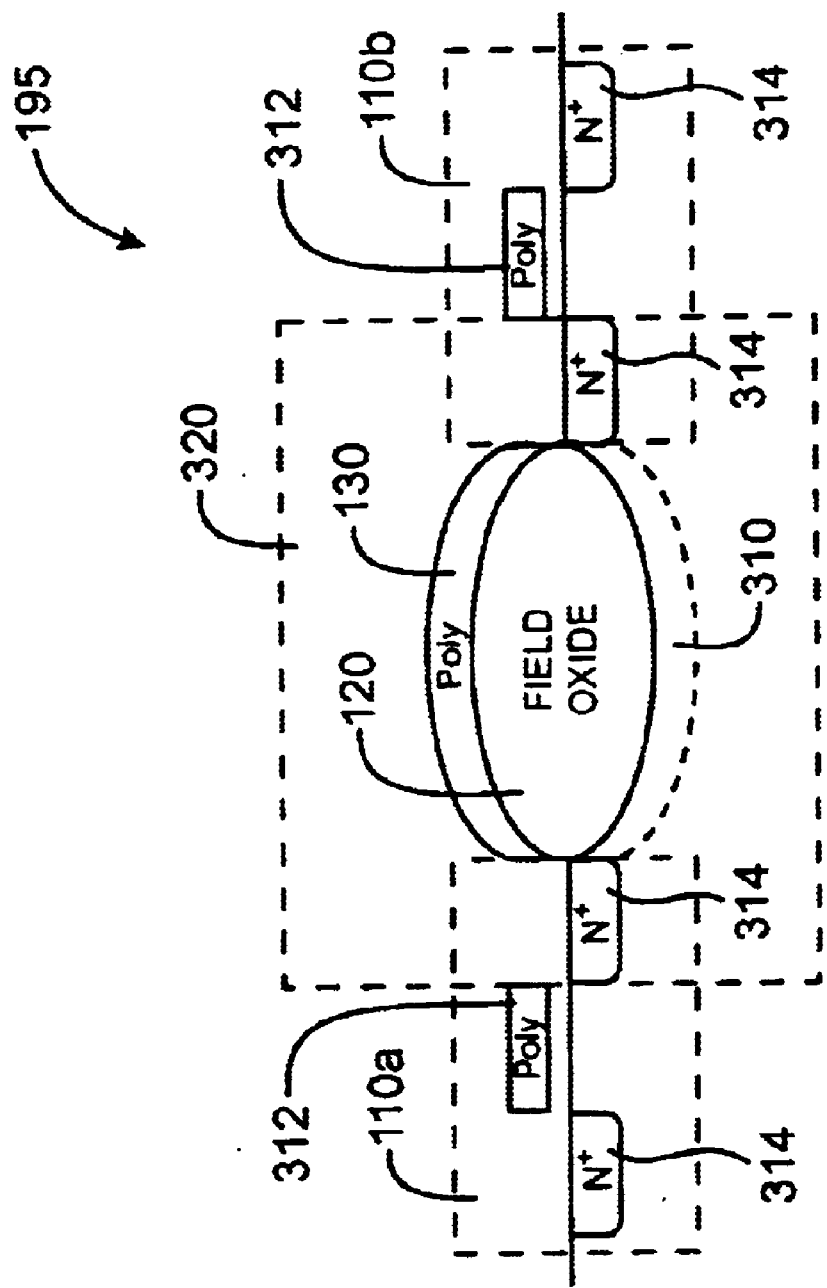
FIG. 3B shows a cross-section of an isolation region transistor with the channel stop implant removed and no well.

Devices 110 may reside in well 125 as shown in FIG. 3A, or may reside directly in the substrate of the integrated circuit as shown in FIG. 3B. Typically, well 125 is doped with a material of opposite polarity from a polarity of diffusion regions 314 of devices 110. Well 125 raises the magnitude of a voltage threshold $V_t$ of devices residing in the well. In the specific embodiment shown, devices 110 are transistors with a gate 312 and n-type diffusion regions 314, and residing in a p-type well 125. However, it will be recognized that devices 110 may be n-type devices as in the specific embodiment, or p-type devices.

A conductor 130 is above field oxide 120. Conductor 130 may be polysilicon, metal, or other conductive material. It may be a conductive trace for carrying interconnection signals, power signals, I/O signals, and the like.

Figure 1:
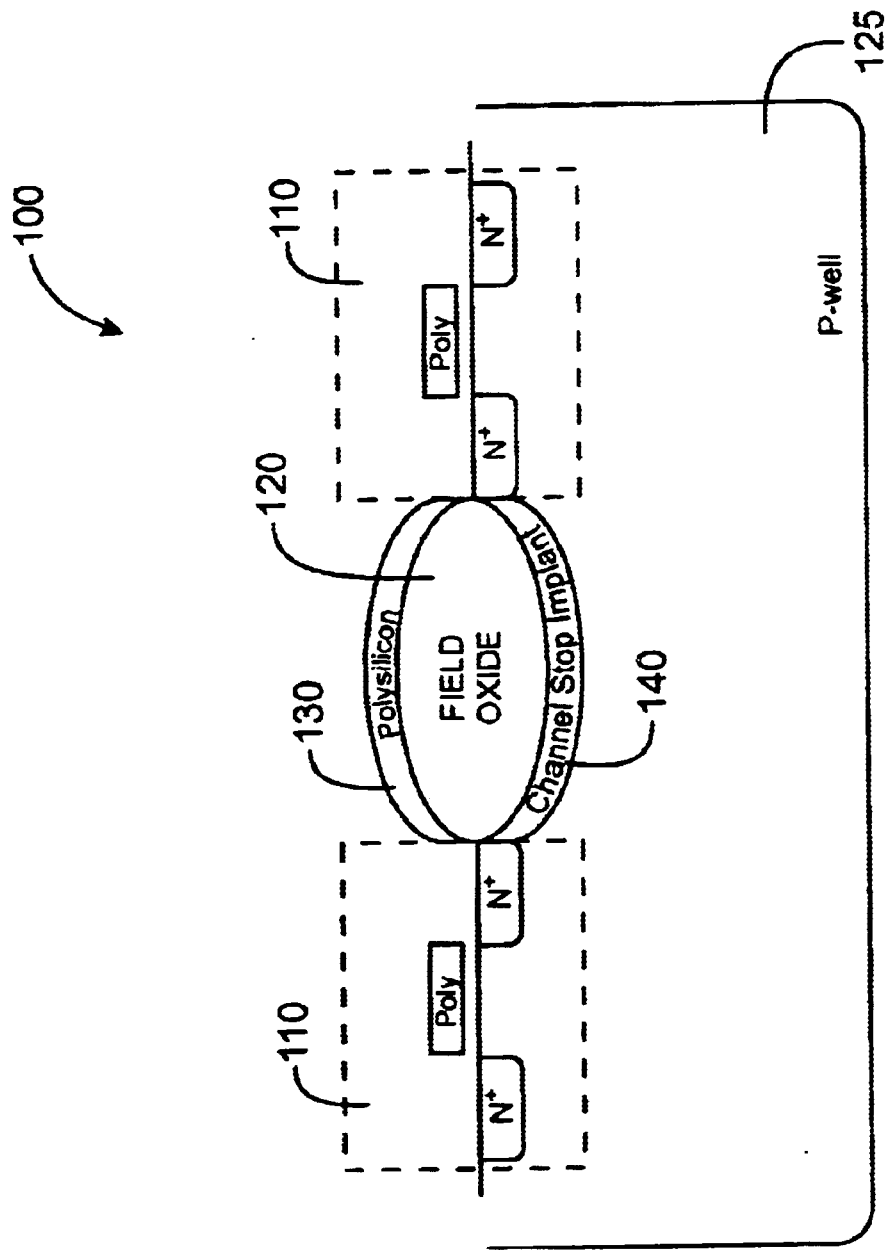
FIG. 1 shows a cross-section depicting a parasitic transistor in an integrated circuit.

In contrast to integrated circuit 100 in FIG. 1, integrated circuit 195 in FIG. 3 has channel stop implant 140 (not shown in FIG. 3A) under only portions of field oxide 120. Channel stop implant 140 is formed by an implantation of ions of the polarity opposite that of diffusion regions 314. For example, for devices with n-type diffusion regions 314, boron may be implanted to form channel stop implant 140. Channel stop implant 140 is selectively not formed, or formed with a shorter length under other portions of field oxide 120. For example, the cross-section of FIG. 3A shows a portion with no channel stop implant.

Selective implantation of channel stop implant 140 for certain portions of integrated circuit 195 offers advantages over the prior art. Areas with no or less channel stop implant 140 form paths connecting devices 110. When sufficient voltage is applied to conductor 130, a conductive path 310 forms between devices 110 along the paths. In effect, this creates an isolation region transistor 320 with conductor 130 acting as a gate, and diffusion regions 314 of devices 110 acting as the source and drain. Conductive path 310 is the channel region and is activated at a lower threshold voltage than those areas that have a traditional channel stop implant 140. As will be discussed further, the magnitude of the voltage threshold may be adjusted by varying the size of channel stop implant 140 and by the removal of well 125.

In operation, when the voltage on conductor 130 is below $V_t$ of isolation region transistor 320, there is no conductive path between devices 110. Therefore, device 110a is decoupled from device 110b. When the voltage that is above $V_t$ for isolation region transistor 320, but below $V_t$ for the areas with channel stop implant 140, then conduction occurs along conductive path 310.

Isolation region transistor 320 may be controlled by higher voltages than typical MOS enhancement transistors. In the past, voltages of less than the supply voltage VDD were used on the transistor gates. Higher voltages would break down the transistors. However, the programming voltage $V_{pp}$ of a programmable logic device, EEPROM, EPROM, or other nonvolatile storage device is typically higher than VDD. For example, $V_{pp}$ may be in a range between 7 to 16 volts. $V_{pp}$ may be generated internally or externally from the integrated circuit.

Using isolation region transistor 320 of the present invention, $V_{pp}$ may be applied to conductor 130 over a field oxide 120 region with no channel stop implant 140 or shorter channel stop implants 140. This activates conductive path 310. As discussed above, this behavior is that of a transistor in the isolation region and is controlled by $V_{pp}$.

Isolation region transistor 320 with a high voltage threshold may be used in a variety of applications. For example, ESD structures, high-voltage switches, pumps, and voltage down-converters. Isolation region transistor 320 may be a p-type or n-type transistor. Use of n-type transistor is more common because high voltages are generally positive values. However, nothing in this specification is meant to limit the use to n-type isolation region transistors. The principles of the present invention may also be used for p-type isolation transistors. In this specification, references to decreasing or increasing voltages refer to the magnitude of the voltage.

FIG. 3B, shows isolation region transistor 320 formed in the substrate with no well 125. The elimination of well 125 decreases the threshold voltage of the isolation region transistor. Some applications may find use for the lower threshold voltage thereby provided. For example, such a device may be used for an over voltage protection circuit with almost no drop in voltage across the transistor due to $V_t$. By selectively adding well 125, varying the size of channel stop implant 140, or completely removing channel stop implant 140, the voltage threshold can be adjusted over a wide range of voltages. Typically, this range may be from approximately two volts to greater than 20 volts.

Figure 3C:
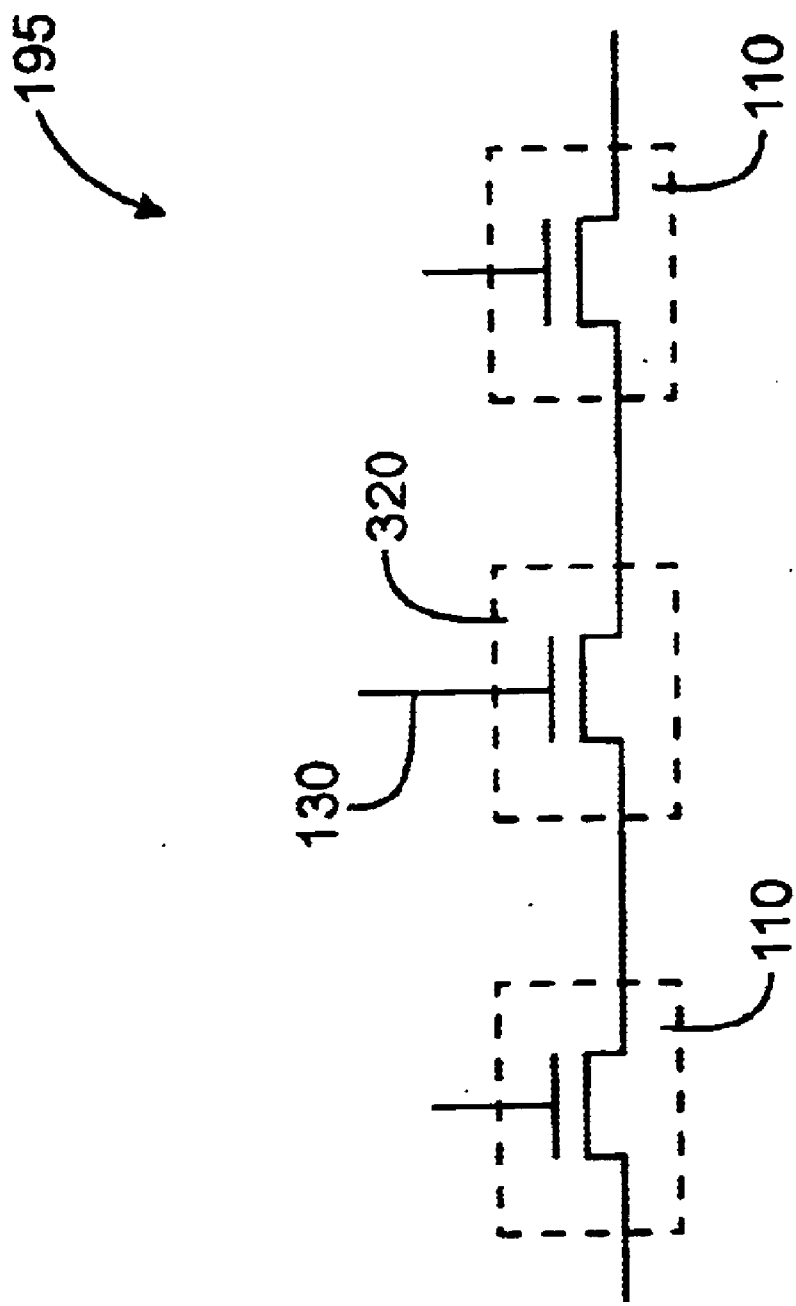
FIG. 3C shows a circuit diagram for the integrated circuits of FIGS. 3A and 3B.

FIG. 3C shows a circuit diagram for the portion of integrated circuit 195 shown in FIGS. 3A and 3B. This diagram is reflective of the design shown in the above figures, but other configurations may also be envisioned in accordance with the present invention. In FIG. 3C, transistor devices 110 are separated by isolation region transistor 320. When a voltage of sufficient magnitude is applied to conductor 130, isolation region transistor 320 allows current to flow between its source and drain.

Figure 4:
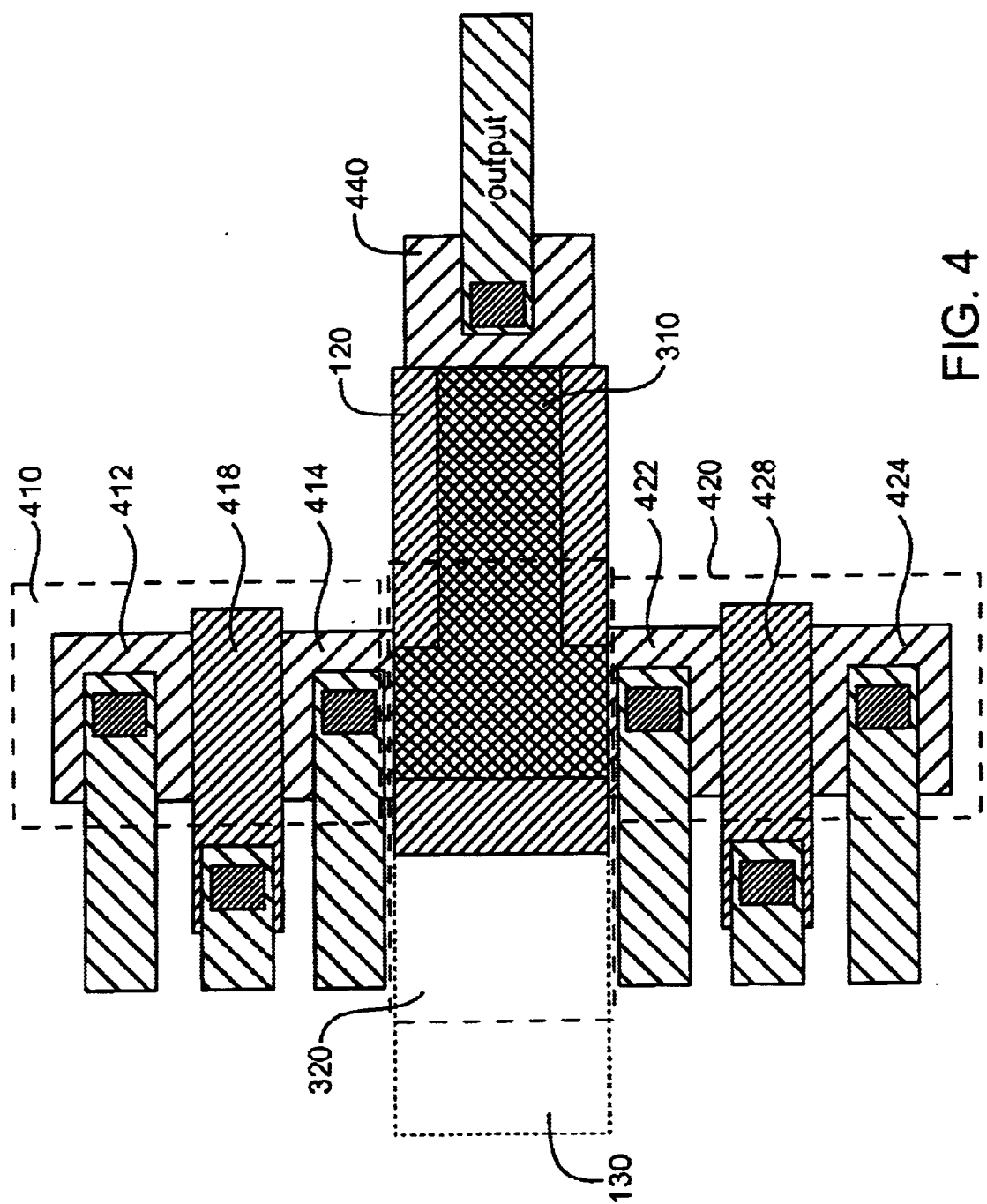
FIG. 4 shows a planar view of two transistors with a conducting path controlled by an isolation region transistor of the present invention.

FIG. 4 shows a planar view (or layout) of a first transistor 410 and a second transistor 420 separated by an isolation region transistor 320 of the present invention. Field oxide 120 electrically isolates the two transistors 410 and 420 from each other and from an output pad 440. An isolation conductive path 310 connects transistors 410 and 420 together and to output pad 440. Isolation conductive path 310 is formed by a mask which allows channel stop implant 140 to be placed everywhere under field oxide 120 except in isolation conductive path 310.

Conductor 130 resides over field oxide 120 and acts as a transistor gate for isolation region transistor 320. When conductor 130 has a sufficient voltage, conductive path 310 allows electrical current to flow along isolation conductive path 310 from the two transistors 410 and 420 to output pad 440.

The first transistor 410 includes a first source/drain region 412 and a second source/drain region 414. A first isolation region under a first gate 418 isolates the first source/drain region 412 from the second source/drain region 414. The second transistor 420 includes a third source/drain region 422 and a fourth source/drain region 424. A second isolation region under a second gate 428 isolates the third source/drain region 422 from the fourth source/drain region 424. A third transistor, the isolation region transistor 320, includes a first drain (the second source/drain region 414), a second drain (the third source/drain region 422), and a source, which is a fifth source/drain region or output pad 440. A third isolation region under field oxide region 120 and third gate or conductor 130 isolates the second source/drain region 414 from the third source/drain region 422. The third isolation region also isolates the second source/drain region 414 and the third source/drain region 422 from the fifth source/drain region or output pad 440.

A possible use for this structure is, for example, in ESD discharge structures. When a high voltage ESD event occurs, the voltage rises on conductor 130 allowing electric charge to discharge from the transistors 410 and 420 to output pad 440. Output pad 440 may be connected to a strong ground. Isolation region transistors 320 may also be used, for example, as a charge pump when high voltages need to be maintained across oxides or junctions. High voltages are possible in this case, because the breakdown voltages of the field oxide are very high, for example 60 volts. Alternatively, as discussed above, the structure shown in FIG. 4 may be used to allow a high-voltages, such as the programming voltage $V_{pp}$, to control isolation region transistor 320.

Figure 5:
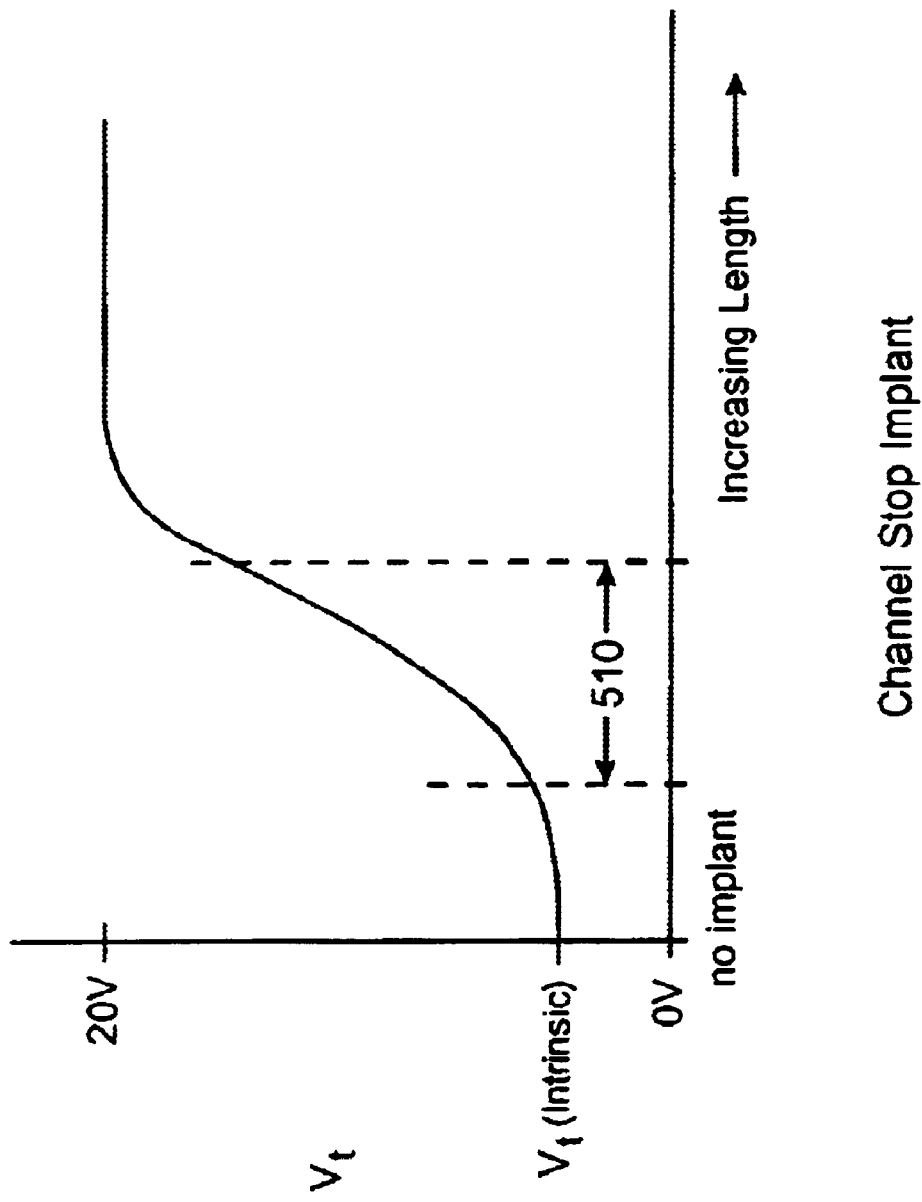
FIG. 5 is a graph plotting the voltage threshold against the length of the channel stop implant.

FIG. 5 is a graph showing the voltage threshold for an isolation region transistor 320 plotted against the length of channel stop implant 140. This graph illustrates another aspect of the present invention. As can be seen, when the length of channel stop implant 140 is large (in comparison to the distance between adjacent devices), the voltage threshold is fairly constant. However, as the length of channel stop implant 140 decreases, the voltage threshold also decreases with a fairly linear slope. When the length of channel stop implant 140 is too small, the transistor begins to act as if there were no channel stop implant 140, and $V_t$ is essentially identical to the intrinsic threshold voltage limits for the technology.

As can be seen in the graph, within a range 510, a change to the length of channel stop implant 140 causes a corresponding change to the voltage threshold of isolation region transistor 320. Accordingly, an integrated circuit designer may choose a specific threshold voltage, and adjust the length of channel stop implant 140 to give the desired threshold voltage.

Using this principle, an adjustable threshold device can be formed by changing the length of channel stop implant 140 according to the threshold voltage desired. No additional mask is required for forming these adjustable threshold devices so the impact to the design process and costs is minimal.

Figure 6:
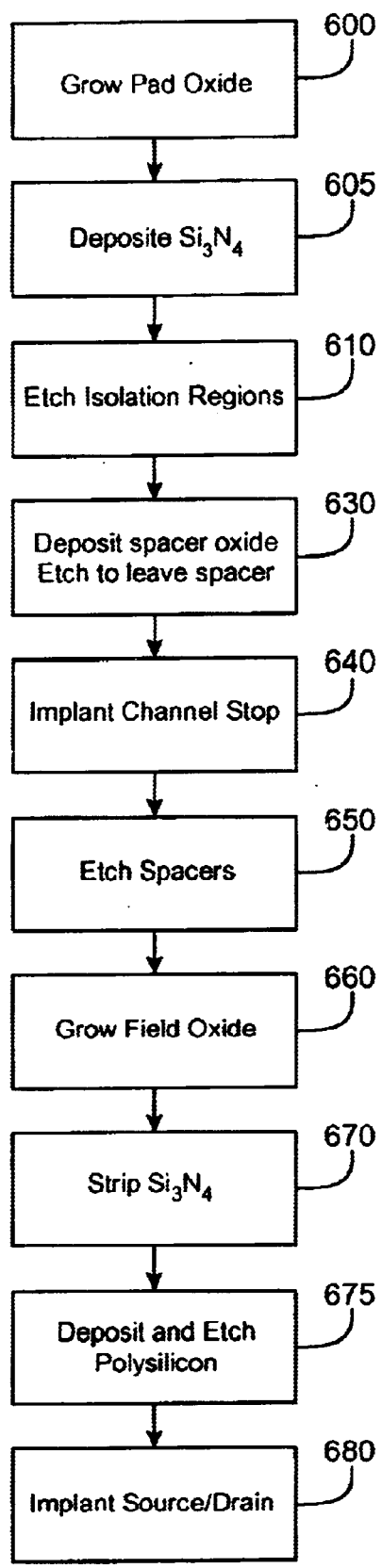
FIG. 6 is a flow diagram of a process for making an isolation region transistor according to the present invention.

FIG. 6 shows a simplified flow diagram of a process for creating isolation region transistors 320 according to the present invention. FIGS. 7A–7J show a simplified cross-section of the integrated circuit at each step in the process. It will be recognized that this is just an example of a method of making isolation region transistors 320. Techniques now known or later developed may be substituted or added to this method which are in keeping with the spirit and scope of the present invention. This diagram is a brief description of the process, that will enable one of skill in the art to practice the invention.

Figure 7A:
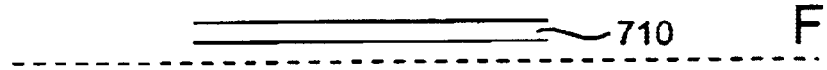
FIGS. 7A–7J show cross sections of the integrated circuit during steps of the process of FIG. 6.

The results of step 600 is shown in FIG. 7A. In step 600, the process grows a pad oxide layer 710 on the substrate. Pad oxide layer 710 is useful in a later step in which a field oxide is grown. Pad oxide layer 710 helps to prevent a silicon nitride layer from cracking during the growing of the field oxide.

Figure 7B:
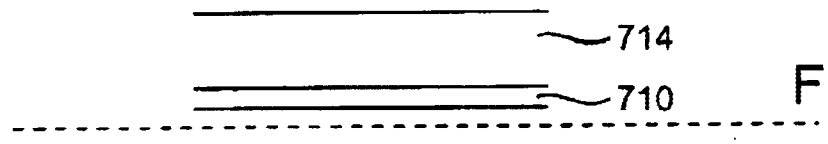
Figure 7C:
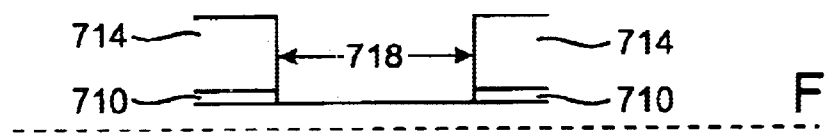

Referring to FIG. 7B, in step 605, the process deposits a layer of silicon nitride 714 ($Si_3N_4$)on pad oxide 710. Silicon nitride 714 forms a barrier to be used in masking off the active areas of the integrated circuit. In step 610, an isolation mask covers silicon nitride 714 leaving exposed the areas in which a field oxide is desired. A solvent etches away the silicon nitride in the exposed areas. The results are depicted in FIG. 7C. In one embodiment of the present invention, a width 718 of the exposed area determines the voltage threshold for an isolation region transistor. By narrowing width 718, the length of the channel stop implant is shortened, lowering the voltage threshold as described above with respect to FIG. 5.

Figure 7D:
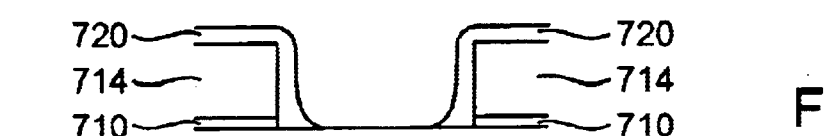

In step 630, spacer oxide is deposited. Openings are etched in the spacer oxide in those places in which a channel stop implant is desired. After etching, spacers 720 remain as shown in FIG. 7D. Spacers 720 shorten the length of the exposed area. The narrower exposed area define the area for deposition of channel stop implant 140. By narrowing the length of the exposed area, a gap will exist between the diffusion regions 314 and channel stop implant 140. Spacers 720 are grown by placing a layer of low temperature oxide LTO and anisotropically etching the LTO.

Figure 7E:
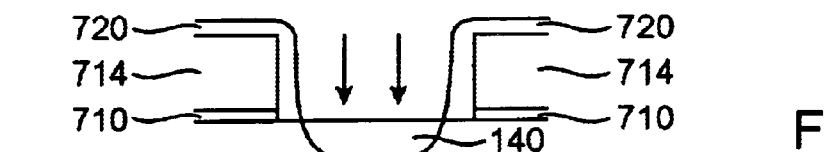

Referring to FIG. 7E, in step 640, channel stop implants 140 are formed by exposing the die to a dopant in those areas in which a channel stop implant is desirable. These areas are defined by a channel stop mask, as is known in the art. The dopant may be, for example, boron with a concentration of $1-2 \times 10^{12}$ cm$^{-2}$. Silicon nitride 714 and spacers 720 mask off the areas that are not to be implanted with channel stop implant 140.

As an alternative to narrowing the width of the field oxide region as discussed in step 610 for adjusting the threshold voltage, in a second embodiment, width 718 of the field oxide remains the same. In the second embodiment however, the length of channel stop implant 140 may be adjusted by changing the channel stop mask. By shortening the length of the mask openings, a smaller region is exposed during the implantation of channel stop 140 implants, thereby adjusting the length of channel stop implants 140. As previously discussed, within a range, shorter channel stop implants cause the threshold voltage to be lower.

Figure 7F:
Figure 7G:
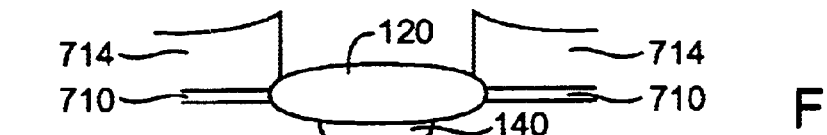

In step 650, spacers 720 are etched (wet) isotropically. This step removes spacers 720 so that the area for the isolation region is exposed as shown in FIG. 7F. Then, in step 660 and shown in FIG. 7G, the field oxide 120 is grown in the isolation region.

Figure 7H:
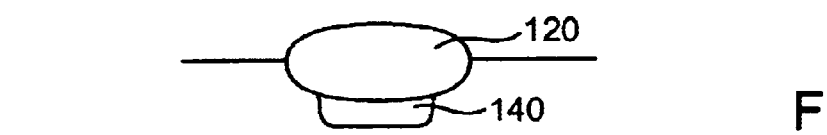
Figure 7I:
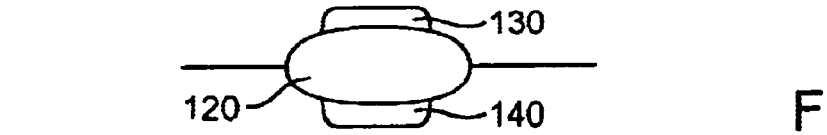
Figure 7J:
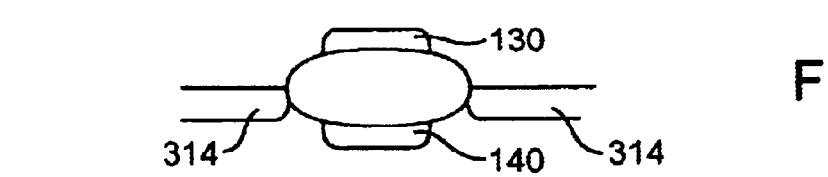

In step 670, silicon nitride 714 is stripped away as shown in FIG. 7H. In step 675, a layer of polysilicon is deposited and a mask used to etch away polysilicon that is not desirable. Transistor gates and other conductors are formed in this fashion. FIG. 7I shows conductor 130, which is the gate for isolation region transistor 320 as one of the polysilicon conductors that may be formed in this step. Finally, in step 680, the diffusion regions 314 are implanted for the active devices as shown in FIG. 7J.

Of course, other steps such as the deposition of the polysilicon and metal layers, and the like, will also be done to complete the processing. However, these are not necessary to the understanding of this invention and are left out for simplicity. These processes are well known in the art.

An advantage to this process is that the designer has control over the voltage threshold without a process change from existing methods. Adjustments can be made to the layout design without adding new process steps or masks. This gives designers added flexibility, without any cost in terms of fabrication processes.

An apparatus and method of creating isolation region transistors has been disclosed. Specific embodiment has been taught using examples and drawings. It will be understood that the specific embodiments are given by way of example only, and are not meant to describe additional limitations above those given in the claims. It will be recognized by one of skill in the art that changes may be made to the examples shown, without departing from the spirit and scope of the present invention. Such changes are anticipated by this invention.

What is claimed is:

1. An integrated device structure comprising:
    a first device comprising:
        a first source/drain region;
        a second source/drain region;
        a first isolation region between the first source/drain region and the second source/drain region; and
        a first gate over the first isolation region, wherein the first gate is capable of inducing conduction between the first source/drab region and the second source/drain region;
    a second device comprising:
        a third source/drain region;
        a fourth source/drain region;
        a second isolation region between the third source/drain region and the fourth source/drain region; and
        a second gate over the second isolation region, wherein the second gate is capable of inducing conduction between the third source/drain region and the fourth source/drain region; and
    a third device comprising:
        the second source/drain region;
        the third source/drain region;
        a fifth source/drain region;
        a third isolation region, under a field oxide layer, between the second source/drain region, the third source/drain region, and the fifth source/drain region;
        a first channel stop region in the third isolation region and approximately between the second source/drain region and the fifth source drain region;
        a second channel stop region in the third isolation region and approximately between the third source/drain region and the fifth source/drain region, the first channel stop region separated from the second channel stop region such that an isolation conductive path is formed between the first channel stop region and the second channel stop region; and
        a third gate over the third isolation region,
        wherein the third gate is capable of inducing conduction in the isolation conductive path between the second source/drain region, the third source/drain region, and the fifth source/drain region.

2. The integrated device structure of claim 1 wherein the third isolation region is covered with field oxide.

3. The integrated device structure of claim 2 wherein the first device has a first threshold voltage, the second device has a second threshold voltage, and the third device has a third threshold voltage, wherein the first threshold voltage is approximately equal to the second threshold voltage, and the third threshold voltage is greater than the first threshold voltage and the second threshold voltage.

4. The integrated device structure of claim 3 wherein the third device is used for electro-static discharge protection.

5. An integrated circuit device comprising:
    a first drain comprising a first source/drain region;
    a second drain comprising a second source/drain region;
    a source comprising a third source/drain region;
    an isolation region between the first drain, the second drain, and the source;
    a first channel stop region in the isolation region and approximately between the first drain and the source;
    a second channel stop region in the isolation region and approximately between the second drain and the source, the first channel stop region separated from the second channel stop region such that an isolation conductive path is formed between the first channel stop region and the second channel stop region; and
    a gate over the isolation region capable of inducing conduction in the isolation conductive path between the first drain, the second drain, and the source.

6. The integrated circuit device of claim 5 further comprising a field oxide layer over the isolation region and below the gate.

7. The integrated circuit device of claim 6 wherein the first source/drain region comprises an n-type region, the second source/drain region comprises an n-type region, and the third source/drain region comprises an n-type region.

8. The integrated circuit device of claim 5 wherein the isolation conductive path is bounded by a plurality of channel stop regions.

9. An integrated circuit device comprising:
  a first n-type region in a p-type region;
  a second n-type region in the p-type region;
  a third n-type region in the p-type region, the p-type region having an isolation conductive path between the first n-type region, the second n-type region, and the third n-type region, the isolation conductive path bounded by a first channel stop region and a second channel stop region, the first channel stop region not in contact with the first channel stop region; and
  a gate over the isolation conductive path between the first n-type region, the second n-type region, and the third n-type region,
  wherein a first positive voltage applied to the gate relative to the isolation conductive path induces conduction between the first n-type region, the second n-type region, and the third n-type region.

10. The integrated circuit device of claim 9 further comprising a field oxide layer above the isolation conductive path and below the gate.

11. The integrated circuit device of claim 10 wherein the isolation conductive path is bounded by a plurality of channel stop regions.

12. An integrated circuit device, comprising:
  a first diffusion region;
  a second diffusion region;
  an isolation region formed between the first diffusion region and the second diffusion region; and
  a channel stop region having an opening and formed approximately inside the isolation region, wherein the channel stop region opening determines a lateral conduction path between the first diffusion region and the second diffusion region, and a threshold voltage at which conduction occurs.

13. The integrated circuit device of claim 12, wherein the magnitude of the threshold voltage at which conduction occurs from the first diffusion region to the second diffusion region is lower along the conduction path than it is elsewhere in the isolation region.

14. The integrated circuit device of claim 12 further comprising a first active device, the first active device comprising:
  a first drain region;
  a first gate electrode; and
  a first source region formed by the first diffusion region; and
  a second active device, the second active device comprising:
    a second drain region;
    a second gate electrode; and
    a second source region formed by the second diffusion region,
    wherein the first active device and the second active device are of similar device type.

15. The integrated circuit device of claim 14 wherein the first active device and the second active device are both n-type enhancement-mode devices.

16. The integrated circuit device of claim 12 further comprising a gate electrode formed from a conductive region above the isolation region.

17. The integrated circuit device of claim 16 wherein the conductive region is polysilicon.

18. The integrated circuit device of claim 16 further comprising a thick oxide region above the isolation region and below the gate electrode.

19. The integrated circuit device of claim 18 further comprising a doped well region, wherein the isolation region resides in the doped well.

20. The integrated circuit device of claim 18, wherein the first active device and the second active device are similarly oriented such that lengths of the first active device are parallel with lengths of the second active device.

21. The integrated circuit device of claim 12 wherein the threshold voltage ranges from 2 volts to 20 volts.

22. The integrated circuit device of claim 12 wherein the threshold voltage is at or below a voltage used to configure memory cells on the integrated circuit.

23. The integrated circuit device of claim 22 wherein the threshold voltage ranges between 6 volts and 16 volts.

24. An integrated circuit comprising:
  a first device comprising:
    a first source/drain region;
    a second source/drain region; and
    a first isolation region between the first source/drain region and the second source/drain region;
  a second device comprising:
    a third source/drain region;
    a fourth source/drain region; and
    a second isolation region between the third source/drain region and the fourth source drain region;
  a third isolation region between the second source/drain region and the third source/drain region, the third isolation region under field oxide, the field oxide under a first gate; and
  a channel stop region having an opening, the opening defining a lateral isolation conductive path in the third isolation region between the second source/drain region and the third source drain region.

25. The integrated circuit of claim 24 wherein the first device and the second device are similar type devices.

26. The integrated circuit of claim 25 wherein the first source/drain region comprises an n-type region, the second source/drain region comprises an n-type region, the third source/drain region comprises an n-type region, and the fourth source/drain region comprises an n-type region.

27. The integrated circuit of claim 26 wherein the first isolation region is covered by a second gate and the second isolation region is covered by a third gate.

28. The integrated circuit of claim 24 wherein the conductive path is bounded by a plurality of channel stop regions.

* * * * *